(12) United States Patent
Woerz et al.

(10) Patent No.: US 8,674,524 B1
(45) Date of Patent: Mar. 18, 2014

(54) ALIGNMENT MARKS AND A SEMICONDUCTOR WORKPIECE

(71) Applicant: Infineon Technologies AG, Neubiberg (DE)

(72) Inventors: Andreas Woerz, Kelheim (DE); Erwin Steinkirchner, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/650,197

(22) Filed: Oct. 12, 2012

(51) Int. Cl.
*H01L 23/544* (2006.01)

(52) U.S. Cl.
USPC .......................................... 257/797; 356/401

(58) Field of Classification Search
USPC ............ 257/797; 356/401, 620; 438/401, 462
See application file for complete search history.

(56) References Cited

U.S. PATENT DOCUMENTS 6,841,890 B2 *  1/2005  Fujimoto ...................... 257/797
8,339,604 B2 * 12/2012  Jang et al. ..................... 356/401

OTHER PUBLICATIONS

Dr. Lynn Fuller; Rochester Institute of Technology Microelectronic Engineering; "Wafer Alignment for Canon Stepper"; http://people.rit.edu/lfeee/align; Jan. 14, 2008 ALIGN.PPT; pp. 1-74.

* cited by examiner

*Primary Examiner* — Roy Potter (57) ABSTRACT

An alignment mark may include: an elongate pattern having first and second end portions and a central portion located between the first and second end portions, wherein at least one of the first and second end portions has a larger width than the central portion.

29 Claims, 10 Drawing Sheets

FIG 7B ular. Fine alignment mark set 102 may be formed over a semi-
ALIGNMENT MARKS AND A SEMICONDUCTOR WORKPIECE

TECHNICAL FIELD

Various embodiments relate to alignment marks and a semiconductor workpiece.

BACKGROUND

Modern semiconductor devices such as, for example, integrated circuit (IC) devices or chips may typically be manufactured by processing a semiconductor carrier such as a wafer. Integrated circuits may include a plurality of layers, e.g. one or more semiconducting, insulating, and/or conducting layers, which may be stacked one over the other. In this connection, overlay (alignment) of an upper layer to a lower layer may be important. Alignment marks may typically be used for alignment, for example when aligning lithographically defined layers e.g. by means of a stepper or scanner.

SUMMARY

An alignment mark in accordance with various embodiments may include an elongate pattern having first and second end portions and a central portion located between the first and second end portions, wherein at least one of the first and second end portions has a larger width than the central portion.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The word "exemplary" is used herein to mean "serving as an example, instance, or illustration". Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

Several factors may lead to distorted optical interference patterns being generated during the reading or recognition of alignment marks during the adjustment of lithography layers with a stepper or scanner. These factors may be caused by the adjustment lamp or laser, alignment mark design, depth or corners, resist thickness, and underlying layers. Due to differences in topology, variations in the resist thickness may result on the wafer surface and at the edges of the topological features, namely at the edges of the alignment marks, which lead to the distorted optical interference patterns. These distortions may result in inaccuracies in alignment of the wafer during lithographic exposure.

Figure 1A:
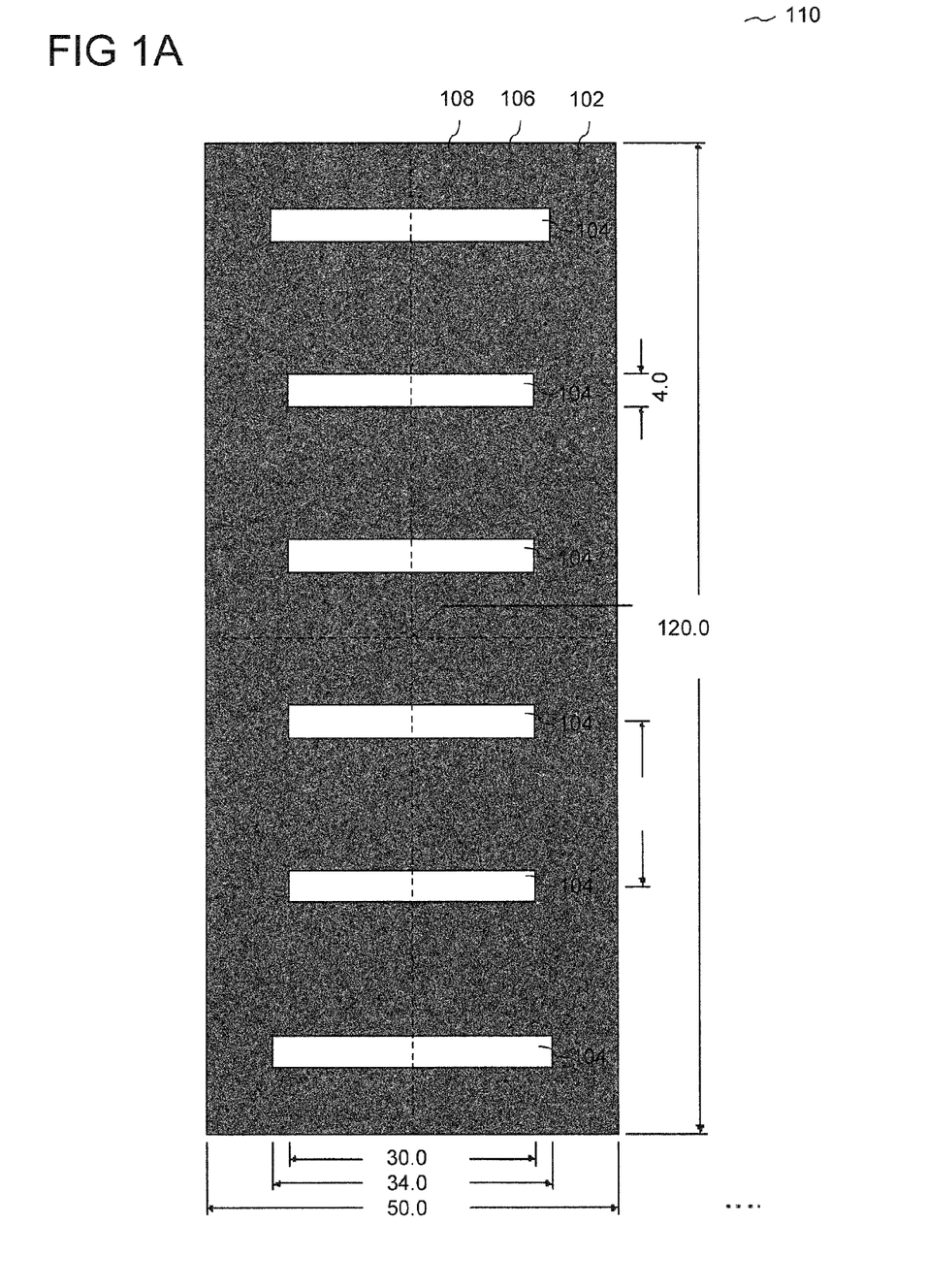
FIG. 1A shows a group of typical fine alignment marks.

FIG. 1A shows top view 110 of a typical fine alignment mark set 102 design which may be used for fine alignment. Fine alignment mark set 102 may include a plurality of alignment marks 104, which may each be substantially rectangular. Fine alignment mark set 102 may be formed over a semiconductor workpiece 106, for example, in an edge or border region 108 of semiconductor workpiece 106 or in the edge or kerf region of a die in a wafer. Semiconductor workpiece 106 may include or be a semiconductor wafer substrate, e.g. a silicon wafer.

Figure 1B:
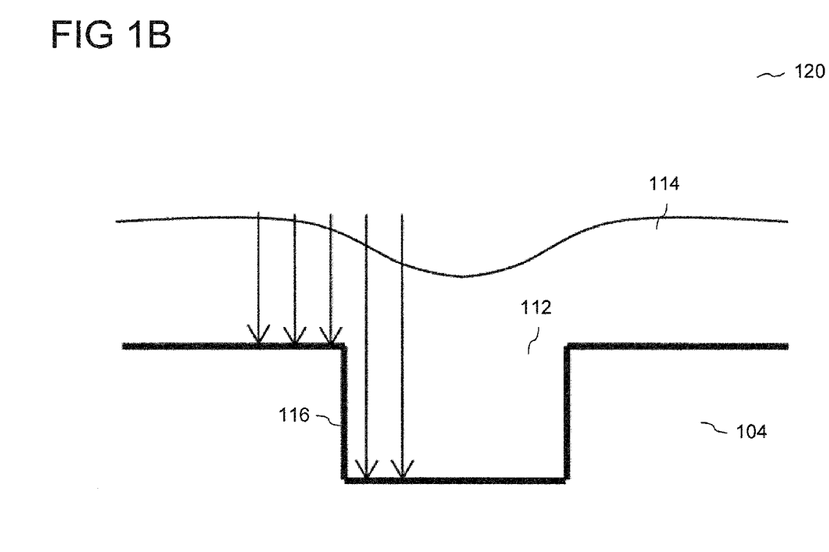
FIGS. 1B and 1C show cross sectional views of typical fine alignment marks.

FIG. 1B shows cross sectional view 120 of alignment mark 104. Alignment mark 104 (referred to as a window design) may include alignment trench 112, which may be formed in semiconductor workpiece 106. For an alignment process, e.g. in a stepper or scanner, resist layer 114 may be deposited over a surface of semiconductor workpiece 106, and may therefore cover fine alignment mark set 102 and alignment marks 104. As shown in view 120, variations in the thickness of resist 114 at the topology edges, e.g. at edge 116 of alignment trench 112, may lead to various interferences of the adjustment light or laser.

Figure 1C:
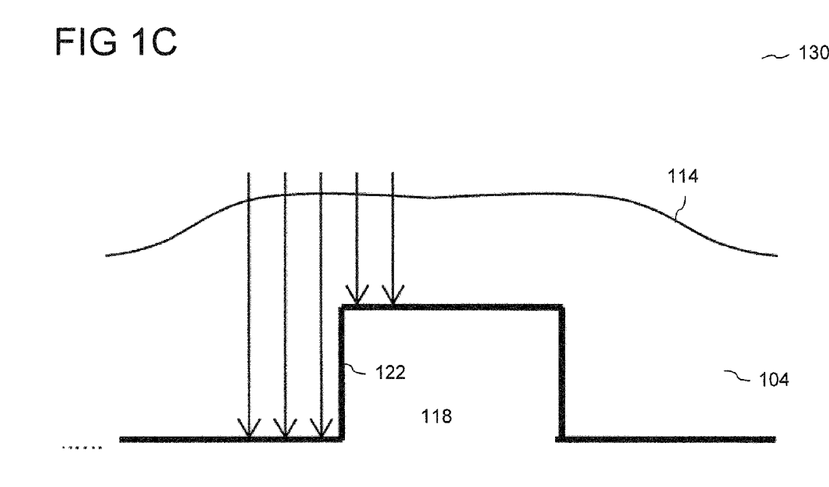

In another example, as shown in cross sectional view 130 of FIG. 1C, alignment mark 104 (referred to as an island design) may include alignment pillar 118. As shown in view 130, variations in the thickness of resist 114 at the topology edges, e.g. at edge 122 of alignment pillar 118, may also lead to various interferences of the adjustment light or laser.

Figure 1D:
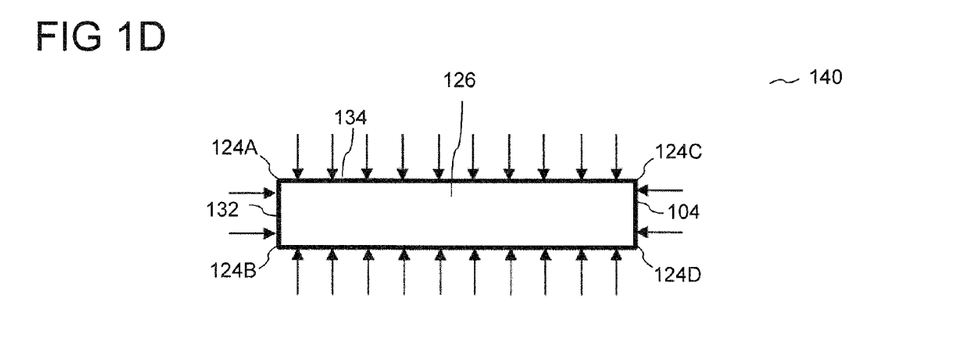
FIGS. 1D and 1E show top views of typical fine alignment marks.
Figure 1E:
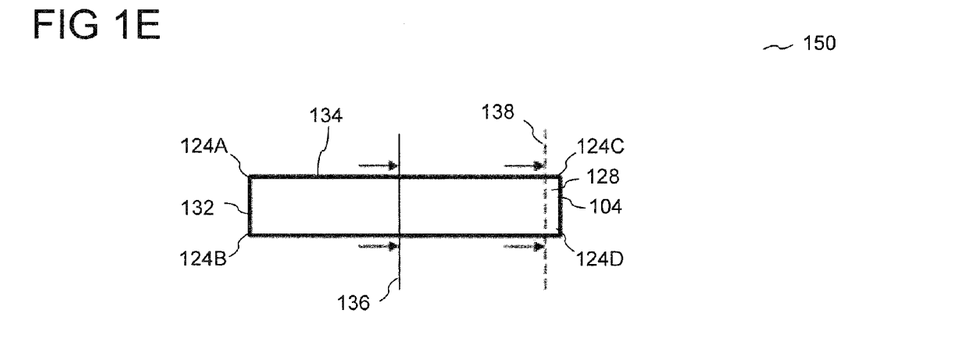
Figure 1F:
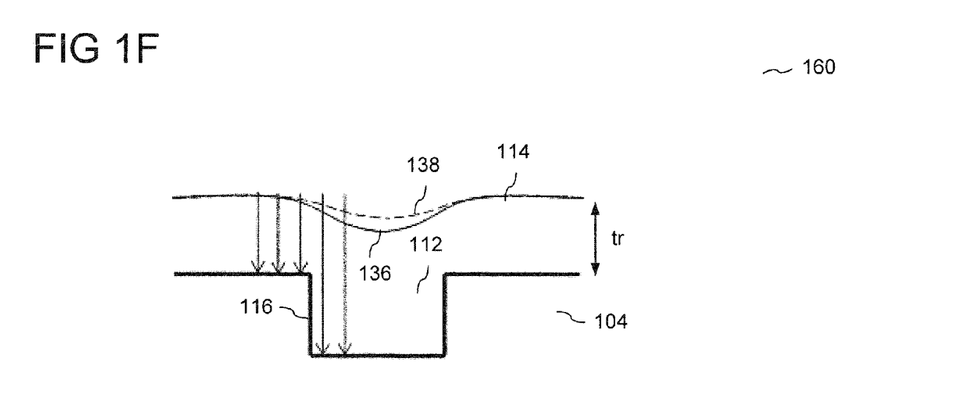
FIG. 1F shows a cross sectional view of a typical fine alignment mark.

FIGS. 1D and 1E show top views 140 and 150 respectively of alignment mark 104. FIG. 1F shows cross sectional view 160 of alignment mark 104, wherein resist 114 may be disposed over alignment mark 104. Generally, the variations in the thickness of resist 114 at corners 124A, 124B, 124C, 124D and/or near corners 124A, 124B, 124C, 124D, i.e the edge regions 128 of alignment mark 104 may be different from the thickness at the middle 126 of alignment mark 104. The fluctuations in the thickness of resist 114 may be affected or influenced by at least two sides in corners of each alignment mark 104. For example, the thickness of resist 114 at corner 124A may be influenced by at least sides 132 and 134 of alignment mark 104. Thickness of resist 114 over a surface of workpiece 106, indicated as "tr" in FIG. 1F, may range from about 0.5 μm to about 3 μm. As shown in FIGS. 1E and 1F, the level and/or thickness of resist 114 at middle region 126 of alignment mark 104 is indicated by line 136. The level and/or thickness of resist 114 at edge region 128 of alignment mark 104 is indicated by dotted line 138. As shown, from the cross sectional view 160 in FIG. 1F, the thickness of resist 114 at middle region (line 136) may be smaller than at the edge region (dotted line 138).

Figure 2A:
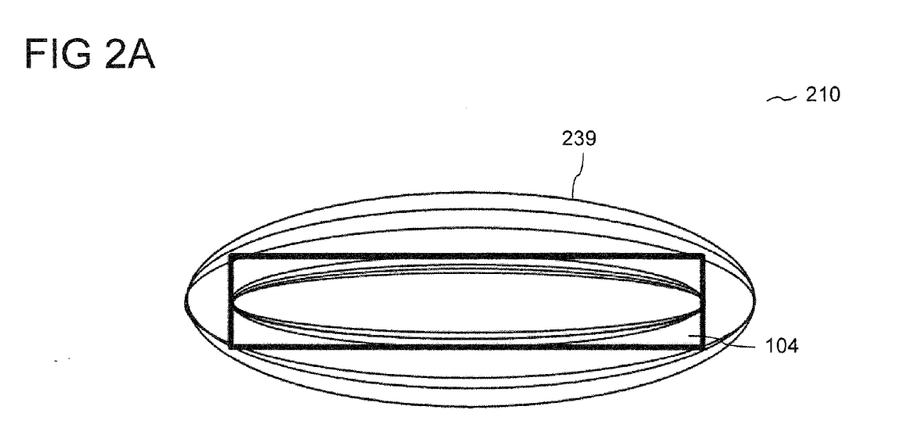
FIG. 2A shows a top view of a typical fine alignment mark and an interference pattern.

A consequence of the thickness variations described in FIGS. 1A to 1E are shown in FIG. 2A. FIG. 2A shows top view 210 of alignment mark 104 and an interference pattern 239 due to thickness variations in the resist disposed over alignment mark 104. Due to variation in resist thickness, a distorted elliptical interference pattern 239 is shown to be obtained, when alignment mark 104 is illuminated by a laser or adjustment lamp, e.g. a HeNe laser or a broadband lamp. Current systems may normally make do with the distorted interference patterns during alignment, which may typically lead to large alignment or adjustment errors, particularly if errors at previous levels are used for future adjustment or alignment.

Figure 2B:
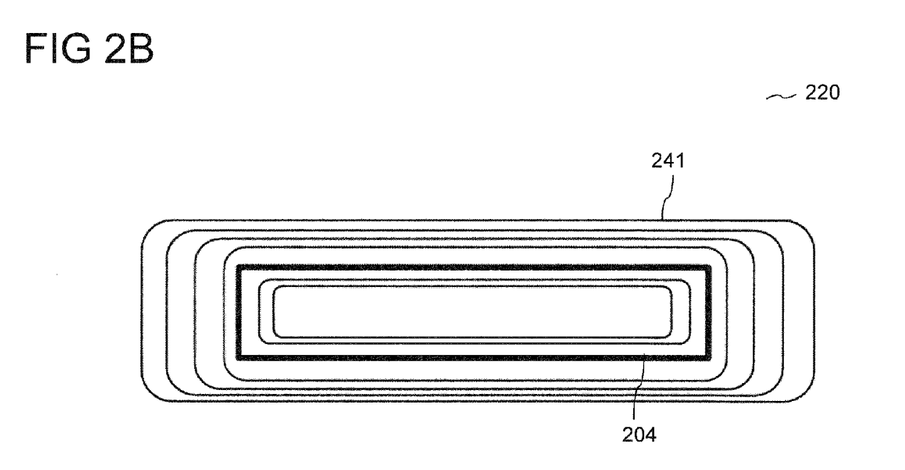
FIG. 2B shows a fine alignment mark with a uniform interference pattern.

FIG. 2B shows alignment mark 204 wherein an ideal uniform interference pattern 241 may be obtained from the middle regions of the alignment mark up to and including edge regions of the alignment mark. In order to achieve the ideal uniform interference pattern 241 as shown in FIG. 2B, different alignment marks may be required.

Figure 3A:
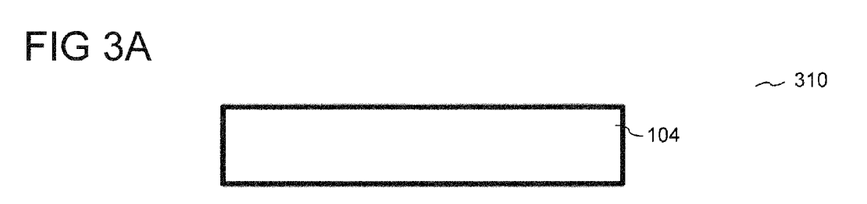
FIG. 3A shows a top view of a typical fine alignment mark.

FIGS. 3B to 3F shows alignment marks 304, e.g. alignment mark 3041, e.g. alignment mark 3042, e.g. alignment mark 3043, e.g. alignment mark 3044, e.g. alignment mark 3045, respectively, according to various embodiments. According to various embodiments, the alignment marks 304 may avoid or prevent the distortion of interference patterns during imaging of the alignment marks, and may achieve the ideal uniform interference pattern 241 described according to FIG. 2B (or an interference pattern substantially closer to the ideal uniform pattern than an interference pattern obtained with conventional alignment marks). FIG. 3A shows alignment mark 104 already described previously, which may lead to uneven interference patterns during imaging of alignment mark 104, and is shown herein for comparison.

According to various embodiments, each alignment mark 304, e.g. each of alignment marks 3041, 3042, 3043, 3044, 3045, may include: an elongate pattern 342 having first 344 and second 346 end portions and central portion 348 located between first 344 and second 346 end portions. At least one of first 344 and second 346 end portions may have a shape that may be configured to reduce a variation of difference between a thickness profile of a resist layer 114 (not shown), which is to be deposited over the elongate pattern 342, at central portion 348 and a thickness profile of the resist layer 114, which is to be deposited over the elongate pattern 342, at at least one of first 344 and second 346 end portions. For example, first end portion 344 and/or second end portion 346 may have a shape that may be configured to reduce a difference between the thickness profiles 136 and 138 shown in FIG. 1F.

According to various embodiments, an alignment mark 304, e.g. each of alignment marks 3041, 3042, 3043, 3044, 3045 may include: an elongate pattern 342 having first 344 and second 346 end portions and central portion 348 located between first 344 and second 346 end portions. At least one of first 344 and second 346 end portions may have a larger width than central portion 348. In other words, first end portion 344 may have width, w1; second end portion 346 may have width, w2, and central portion 348 may have width, wc, wherein at least one of w1 and w2 may be larger than wc.

According to an embodiment, each of first 344 and second end 346 portions may have a larger width than central portion 348. As an example, both w1 and w2 may be larger than wc.

According to some embodiments, elongate pattern 342 may have a vertical dimension, e.g. top to bottom measurement of elongate pattern 342 as a bar or pillar protruding or extending from a surface of the wafer, or, e.g. a cavity measured from the wafer surface. The vertical dimension, e.g. a height of a pillar, or e.g. a depth of a cavity, may be greater than or equal to about 0.2 μm. According other embodiments, elongate pattern 342 may have a vertical dimension in the range from about 0.2 μm to about 2 μm.

According to some embodiments, elongate pattern 342 may have a length, le, that may be greater than or equal to about 20 μm, e.g. in the range from about 20 μm to about 40 μm, e.g. about 25 μm to about 35 μm, e.g. about 30 μm.

According to some embodiments, central portion may have a width, wc, in the range from about 3 μm to about 5 μm, e.g. in the range from about 3.5 μm to about 4.5 μm, e.g. of about 4 μm.

According to some embodiments, central portion may have a length,

According to some embodiments, each of first 344 and second end 346 portions may have a width, w1 or w2, each ranging from about 5 μm to about 15 μm, e.g. from about 8 μm to about 15 μm, e.g. from about 9 μm to about 14 μm, e.g. from about 8 μm to about 10 μm.

According to some embodiments, elongate pattern 342 may be configured as a bar, such as a protrusion, e.g. a pillar as illustrated in 118 of FIG. 1C.

According to embodiments, wherein elongate pattern 342 may be configured as a bar, the bar may have length, le, that may be greater than or equal to about 20 μm, e.g. in the range from about 20 μm to about 40 μm, e.g in the range from about 25 μm to about 35 μm, e.g. of about 30 μm. The bar may have a height, i.e. vertical dimension, greater than or equal to about 0.2 μm, e.g. in the range from about 0.2 μm to about 2 μm.

According to other embodiments, elongate pattern 342 may be configured as a trench, e.g. a cavity as illustrated in 112 of FIG. 1B.

According to embodiments, wherein elongate pattern 342 may be configured as a trench, the trench may have length, le, that is greater than or equal to about 20 μm, e.g. in the range from about 20 μm to about 40 μm, e.g. in the range from about 25 μm to about 35 μm, e.g. of about 30 μm. The trench may have a depth, i.e. vertical dimension, greater than or equal to about 0.2 µm, e.g. in the range from about 0.2 µm to about 2 µm.

Figure 3B:
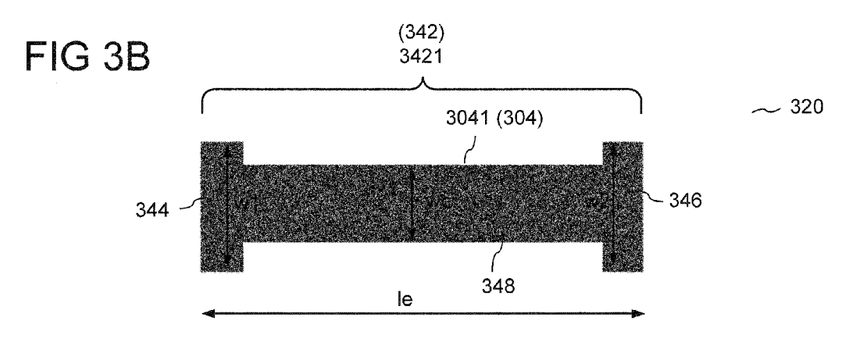
FIGS. 3B to 3F show top views of alignment marks according to various embodiments.

As shown in top view 320 of FIG. 3B, elongate pattern 3421 of alignment mark 3041 may have an "H" shape. In other words, elongate pattern 3421 of alignment mark 3041 may have a "T" shape (or hammerhead shape) at each of two opposing ends. Elongate pattern 3421 of alignment mark 3041 may have first 344 and second 346 end portions and central 348 portion located between first 344 and second 346 end portions. Each end portion 344, 346 may have a larger width, w1 or w2, than central portion 348, wc.

Figure 3C:
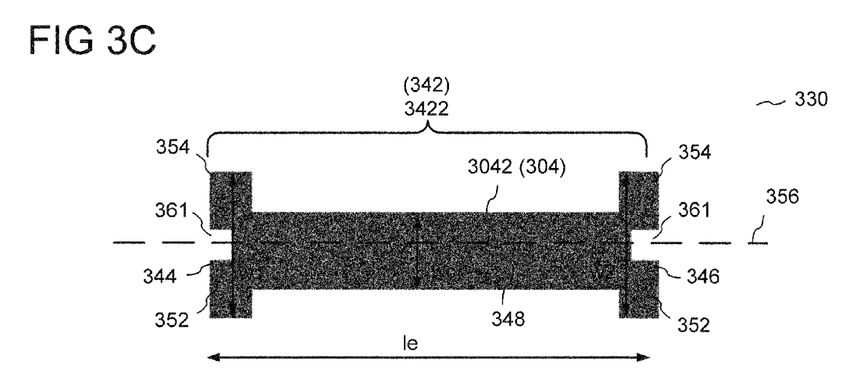

As shown in top view 330 of FIG. 3C, elongate pattern 3422 of alignment mark 3042 may also have an "H" shape.

Elongate pattern 3422 of alignment mark 3042 may also have first 344 and second 346 end portions and central 348 portion located between first 344 and second 346 end portions. Each end portion 344, 346 may have a larger width than central portion 348. Furthermore, each end portion 344 of alignment mark 3042 may include first 352 and second 354 lateral protrusions arranged mirror-symmetrically with respect to a central longitudinal axis 356 of elongate pattern 342. Each of first 344 and second 346 end portions may have groove 361. Groove 361 may be located substantially centrally in each of end portions 344, to create individual protrusions, such as first lateral protrusion 352 and second lateral protrusion 354, which may extend away or outwardly from central portion 348, such that the width, w1 or w2, of end portion 344 or 346 including first and second lateral protrusions 352, 354 may be larger than width, wc, of central portion 348. First and second lateral protrusions 352, 354 may, for example, have a substantially rectangular or quadratic shape. In one or more embodiments, first and second lateral protrusions 352, 354 may be configured as serifs, for example similar to serifs applied to photolithography mask line patterns in accordance with optical proximity correction (OPC) techniques.

Figure 3D:
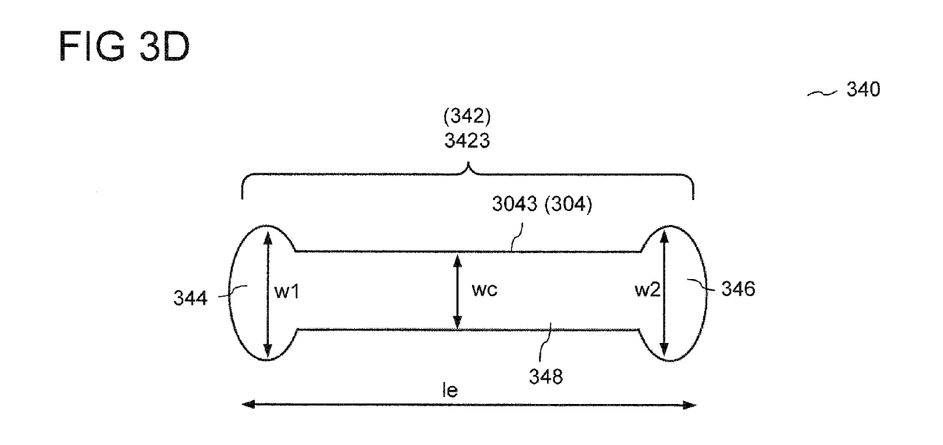

As shown in top view 340 of FIG. 3D, elongate pattern 3423 of alignment mark 3043 may have a "dog-bone" shape. Elongate pattern 3423 of alignment mark 3043 may have first 344 and second 346 end portions and central 348 portion located between first 344 and second 346 end portions. Each end portion 344, 346 may have rounded edges or faces, and each end portion 344, 346 may have a larger width, w1 or w2, than central portion 348, having width wc.

Figure 3E:
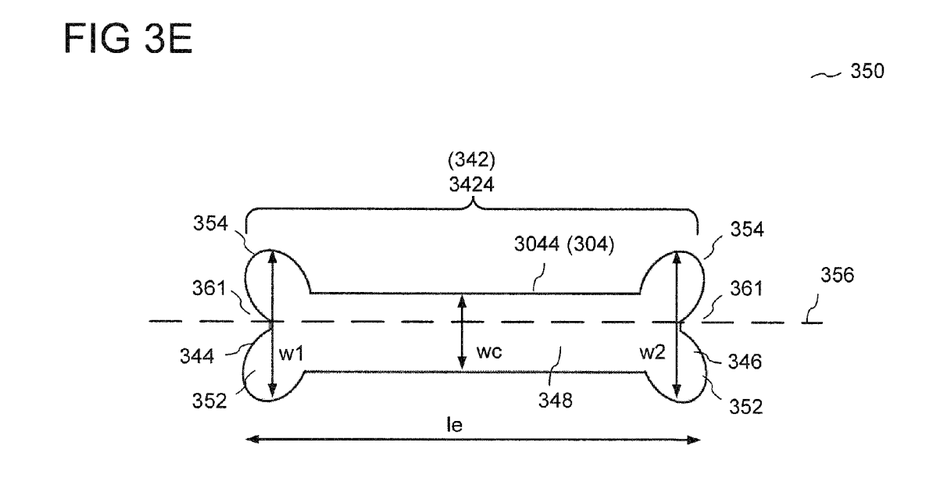

As shown in top view 350 of FIG. 3E, elongate pattern 3424 of alignment mark 3044 may also have a "dog-bone" shape. Elongate pattern 3424 of alignment mark 3044 may have first 344 and second 346 end portions and central 348 portion located between first 344 and second 346 end portions. Each end portion 344, 346 may have rounded edges or faces, and each end portion 344, 346 may have a larger width, w1 or w2, than central portion 348, having width wc. Similarly to elongate pattern 3422 of alignment mark 3042, each end portion 344 of alignment mark 3044 may include first 352 and second 354 lateral protrusions arranged mirror-symmetrically with respect to a central longitudinal axis 356 of elongate pattern 342. Each of first 344 and second 346 end portions may have groove 361. Groove 361 may be located substantially centrally in each of end portions 344, to create individual protrusions, such as first lateral protrusion 352 and second lateral protrusion 354, which may extend away or outwardly from central portion 348, such that the width, w1 or w2, of end portion 344 or 346 including first and second lateral protrusions 352, 354 may be larger than width, wc, of central portion 348. Each end portion 344, 346 may have rounded edges or faces. Similarly, each first 352 and second 354 lateral protrusion may have rounded edges or faces.

Figure 3F:
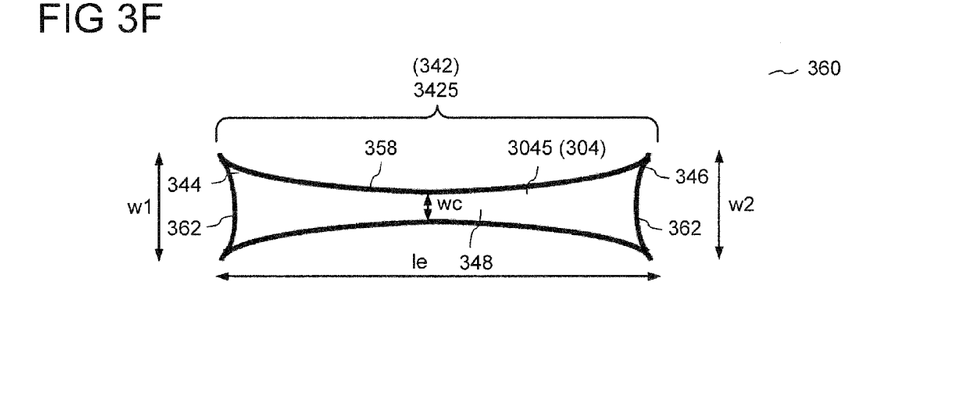

As shown in top view 360 of FIG. 3F, alignment mark 3045 may have an hourglass shape. Elongate pattern 3425 of alignment mark 3045 may also have first 344 and second 346 end portions and central 348 portion located between first 344 and second 346 end portions. Each end portion 344, 346 may have a larger width than central portion 348. At least one sidewall 358 of elongate pattern 342 may have a concave shape, e.g. a curved sidewall. Furthermore, at least one end face 362 of elongate pattern 342 may have a concave shape, e.g. a curved end face. Illustratively, alignment mark 3045 may have a shape that may be opposite to the distortions in the interference pattern 239 shown in FIG. 2A.

Figure 4:
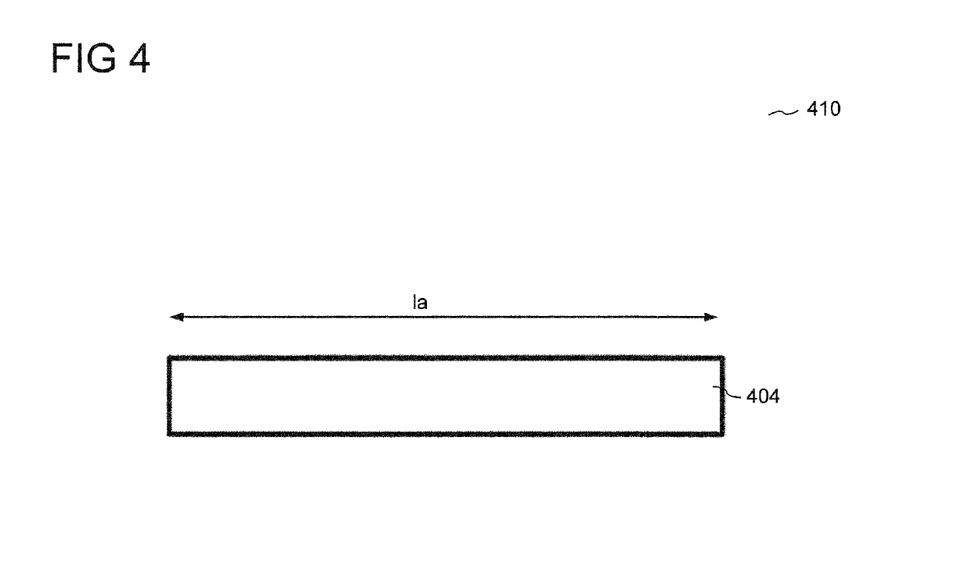
FIG. 4 shows a top view of an alignment mark according to various embodiments.

FIG. 4 shows top view 410 of alignment mark 404 according to an embodiment. Alignment mark 404 may have length, la, which may be longer than a length of typical alignment marks, e.g. longer than the length of alignment marks 104 shown in FIG. 1A. Alignment mark 404 may have a rectangular shape, and may be a bar or cavity. Length, la, may range from about 30 µm to about 40 µm, e.g. from about 35 µm to about 40 µm.

According to various embodiments, alignment mark 304, e.g. each of alignment marks 3041, 3042, 3043, 3044, 3045, and/or alignment mark 404, may be part of a group of alignment marks (e.g. fine alignment marks), also referred to as alignment mark set or multimark.

Figure 5:
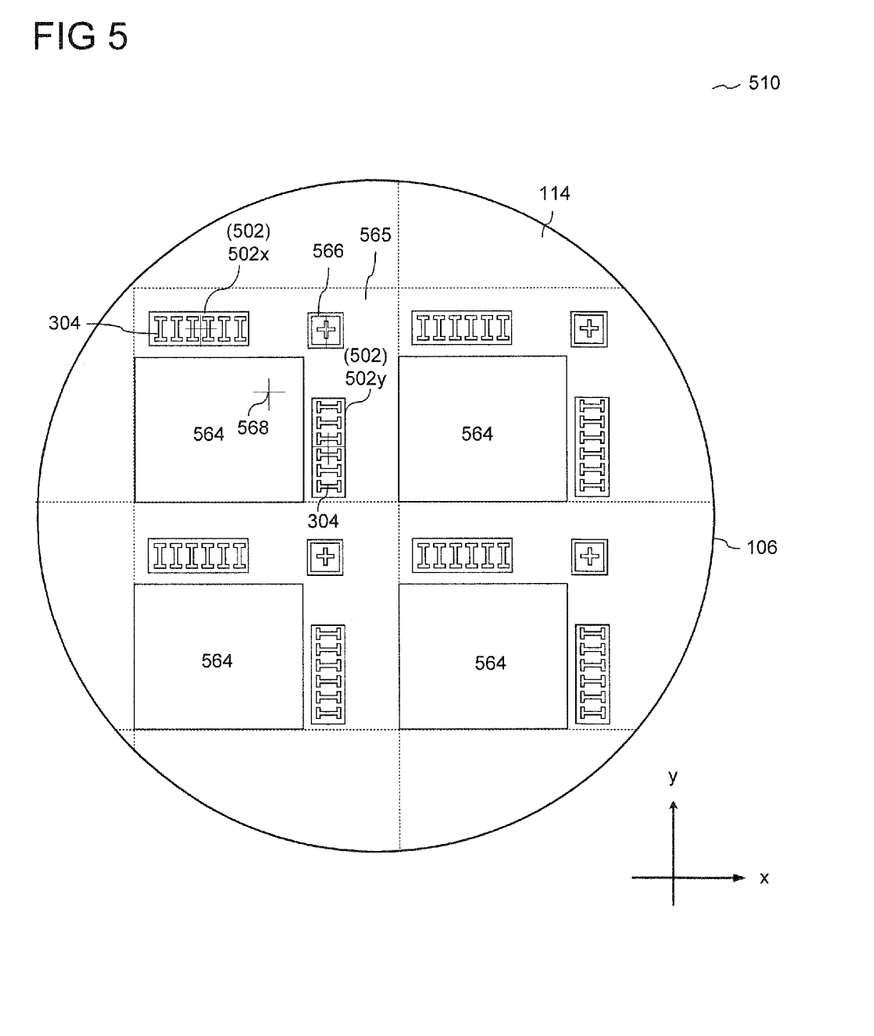
FIG. 5 shows a top view of a semiconductor workpiece including at least one alignment mark according to various embodiments.

FIG. 5 in view 510 shows a top view of semiconductor workpiece 106, which may be a semiconductor wafer, including a plurality of die regions 564. A die region 564 may refer to a region of semiconductor workpiece 106 wherein e.g. through lithographic patterning, e.g. exposure, and semiconductor fabrication processes, one or more electronic devices may be formed. Semiconductor workpiece 106 may include at least one alignment mark 304, including an elongate pattern 342 having first 344 and second 346 end portions and central portion 348 located between first 344 and second 346 end portions. At least one of first 344 and second 346 end portions may have a larger width than central portion 348.

Semiconductor workpiece 106 may include a plurality of alignment marks 304, each alignment mark 304 of the plurality of alignment marks may include an elongate pattern 342 having first 344 and second 346 end portions and central portion 348 located between first 344 and second 346 end portions. At least one of first 344 and second 346 end portions may have a larger width than central portion 348.

A group of alignment marks may be referred to as alignment mark set 502 or multimark as shown in view 510. Alignment mark set 502 may include a plurality of alignment marks 304, e.g. two or more, e.g. six, eight or ten alignment marks 304, and may be formed in a kerf region 565 adjacent to a die region 564 over a top surface of semiconductor workpiece 106. In one or more embodiments, alignment mark 304 may be configured as a fine-alignment mark. In this case, alignment mark set 502 may also be referred to as fine alignment mark set.

At least two TV pre-alignment marks (TV-PA) 566, may be formed over a top surface of semiconductor workpiece 106. As shown in view 510, only four die regions 564 are illustrated in semiconductor workpiece 106 for the sake of simplicity. It may be understood however, that it may be common for semiconductor workpiece 106 to include a plurality of dies, e.g. tens, hundreds or even thousands of dies. Each die region 564 may be surrounded by a kerf or edge region 565, wherein fine alignment mark sets 502 and/or TV pre-alignment marks 566 may be formed.

Figure 6:
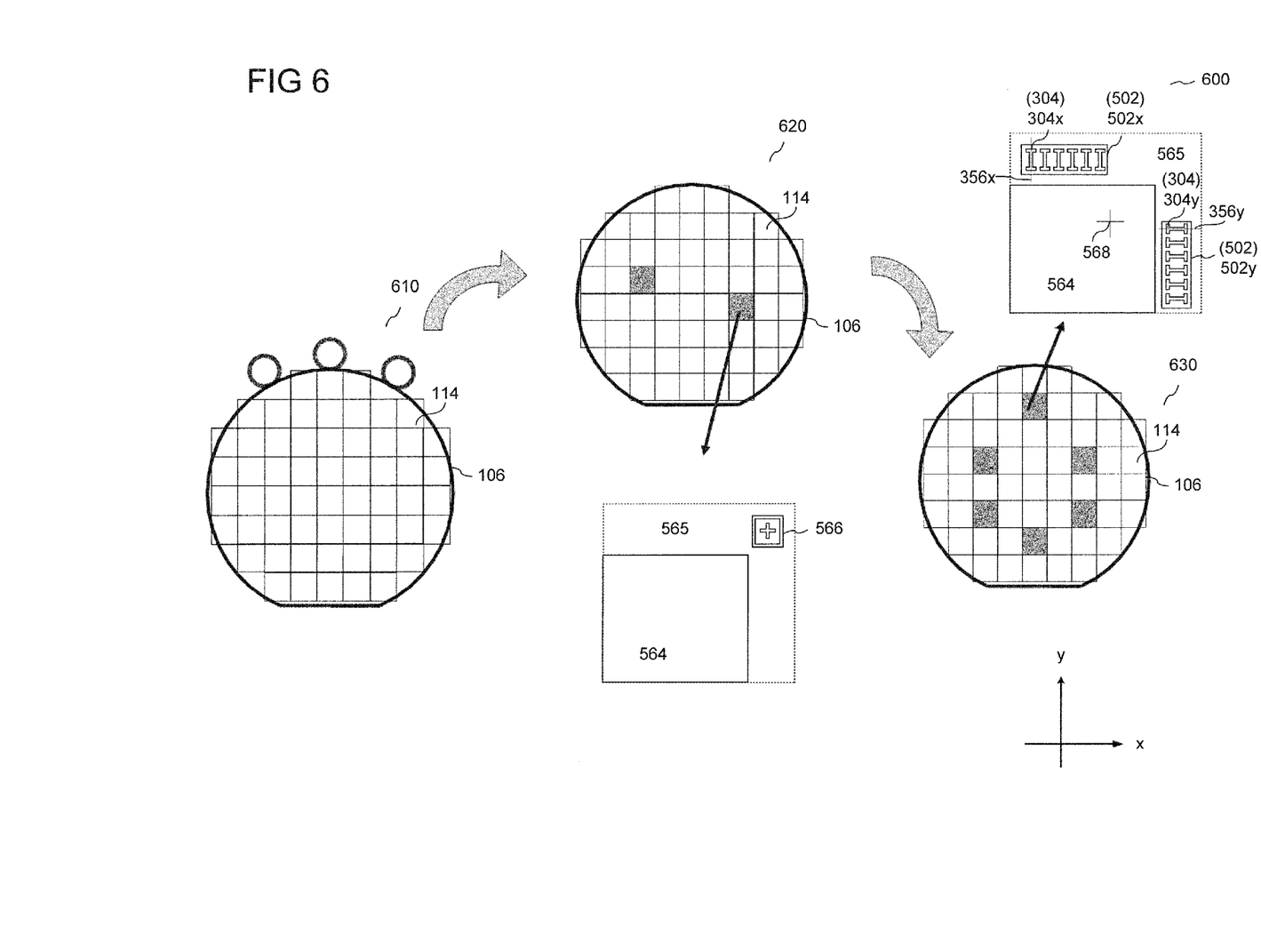
FIG. 6 shows an illustration of an alignment process according to various embodiments.

FIG. 6 shows illustration 600 of an alignment process according to various embodiments. In preparation for photolithographic exposure, resist 114 may be formed over the top surface of semiconductor workpiece 106 as shown in FIG. 5. Furthermore, a reticle or photomask may be aligned to the stepper or to an optical column of the stepper using fiducial reticle marks located at the edge regions of the reticle.

In 610, basic wafer alignment may be carried out, and semiconductor workpiece 106 may be placed on a moveable stage.

Semiconductor workpiece 106 may be aligned with respect to a stepper or scanner using the different sets or types or groups of alignment marks. Subsequently, in 620, pre-alignment may be carried out using a first group of alignment marks, e.g. TV pre-alignment marks 566. At least two TV pre-alignment marks 566 as shown in the darkened die regions of semiconductor workpiece 102 may be used to adjust for rotation and may be used to carry out an alignment of lower accuracy. TV pre-alignment marks 566 may be detected with lower magnification and prepositioned using moving or rotating a stage in x (horizontal) and y (vertical) directions for block x-y pre-positioning. Alignment using TV pre-alignment marks 566 may only provide accuracy between about 2 µm to about 4 µm, and may be carried out using an off axis-scope.

In 630, a second group of alignment marks, e.g. fine alignment mark sets 502, e.g. 502x, 502y, may subsequently be used to refine alignment provided previously by TV pre-alignment marks, in an auto global alignment (AGA) process. Each fine alignment mark set 502 may include a plurality of alignment marks 304. Each alignment mark 304 may be configured as a fine-alignment mark of semiconductor workpiece 106.

An adjustment light, e.g. Broadband (612+/−35 nm) or a HeNe laser (612 nm) may be used to illuminate the fine alignment mark sets 502. Each kerf region 565 may include a first fine alignment mark set 502x of alignment marks in the x direction, and second fine alignment mark set 502y of alignment marks in the y direction. First set 502x may be arranged wherein alignment marks 304x may be arranged in an x direction with respect to each other. Second set 502y may be arranged wherein alignment marks 304y may be arranged in a y direction with respect to each other. Alignment marks 304x and alignment marks 304y may face directions substantially perpendicular to each other. For example, a longitudinal axis 356x of alignment mark 304x may be perpendicular to an x direction, and a longitudinal axis 356y of alignment mark 304y may be parallel to the x direction.

Both first set 502x and second set 502y may need to be used in order to locate the center 568 for each of sets 502x and 502y. An image of fine alignment mark sets 502x and 502y may be viewed and analyzed. A moveable stage carrying semiconductor workpiece 106 may move in an x-y direction and may place first set 502x under a first alignment microscope, e.g. a C-scope. The image of the fine alignment mark set may be analyzed to determine the correction in the x alignment, in other words, to determine a block X position. The stage carrying semiconductor workpiece 106 may move in an x-y direction to place second set 502y under a second alignment microscope, e.g. a B-scope. The image of the fine alignment mark set may be analyzed to determine the correction in the y alignment, in other words, to determine a block y position. The stepper machine may then calculate the stage position to center the die region 564 of semiconductor workpiece 106 under an optical column of the stepper, using the located center 568. The stage may move the semiconductor workpiece 106 such that die region 564 is directly centered under the optical column.

As this process aligns the semiconductor workpiece 106 with respect to the optical column, and as the reticle may already have been aligned with respect to the optical column, exposure may be carried out through the reticle wherein selected portions of resist 114 formed over semiconductor workpiece 106 may be exposed. In particular, selected portions of resist 114 formed over die regions 564, such as selected portions not blocked by reticle, may be exposed to light, e.g. UV light.

Figure 7A:
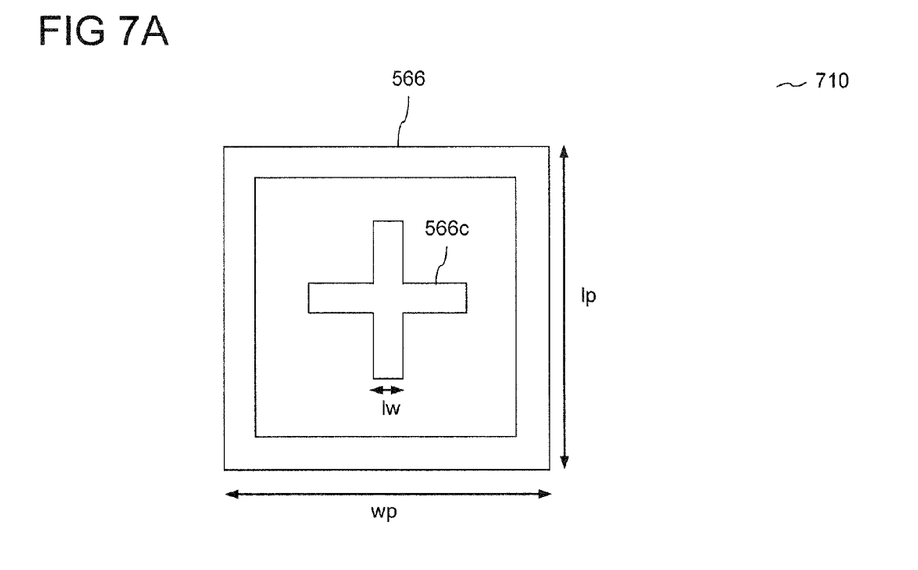
FIG. 7A shows a pre-alignment mark.

FIG. 7A shows top view 710 of a TV pre-alignment mark 566. As shown in view 710, pre-alignment mark 566 may include generally a fan out structure, e.g. such as a cross shaped structure 566c. Each TV pre-alignment mark 566 may generally be quite large, and may have a width, wp, or length, lp, ranging from about 40 µm to about 100 µm, e.g. from about 50 µm to about 80 µm, e.g. from about 55 µm to about 65 µm, e.g. about 60 µm. The width, lw, of the cross-shaped structure 566c may range from about 5 µm to about 10 µm, e.g. about 6 µm.

Figure 7B:
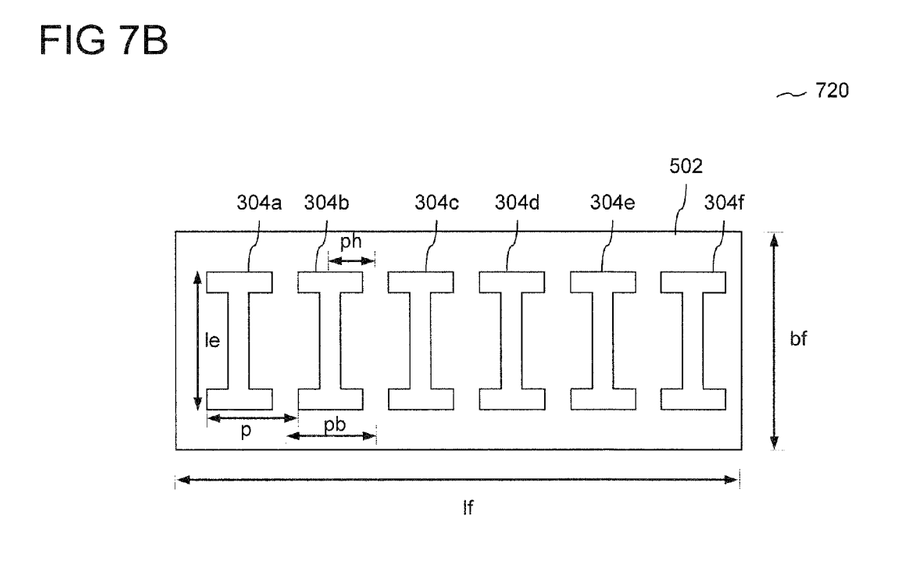
FIG. 7B shows a fine alignment mark set according to various embodiments.

FIG. 7B shows top view 710 of fine alignment mark set 502 according to an embodiment. As shown in view 720, fine alignment mark set 502 may include a plurality of alignment marks 304. By way of example, fine alignment mark set 502 may have six alignment marks, e.g. six alignment marks 304a, 304b, 304c, 304d, 304e, 304f. It may be understood that the number of alignment marks 304 per fine alignment mark set 502 may vary according to other embodiments, e.g. may be more or less than six. Each alignment mark 304 may be separated from a neighboring alignment mark 304 by a pitch p of about 20 µm, e.g. ranging from about 10 µm to about 30 µm, e.g. from about 15 µm to about 25 µm. Pitch p may be referred to as a pitch between the bars, e.g. between a first edge of a first alignment mark 304a and an analogous edge of a second alignment mark 304b, the second alignment mark 304b neighboring or directly adjacent to the first alignment mark 304a. A half pitch, ph, may refer to half the distance between neighboring alignment marks, e.g. half the distance between first alignment mark 304a and second alignment mark 304b, e.g. half of pitch, p.

Each alignment mark 304 may be separated from a neighboring alignment mark by a pitch of blank area, pb, of about 20 µm, e.g. ranging from about 10 µm to about 30 µm, e.g. from about 15 µm to about 25 µm. As illustrated in FIG. 7B, pitch of blank area, pb, may refer to a distance between a center region of a space between first alignment mark 304a and second alignment mark 304b, and an analogous center region of a space between second alignment mark 304b and third alignment mark 304c. Each fine alignment mark set 502 may have a length, lf, ranging from about 100 µm to about 600 µm, e.g. from about 150 µm to about 300 µm, e.g. from about 150 µm to about 200 µm. Each fine alignment mark set 502 may have a breadth, bf, ranging from about 25 µm to about 50 µm, e.g. about 30 µm to about 45 µm, e.g. about 35 µm to about 40 µm.

Various embodiments provide an alignment mark, including: an elongate pattern having first and second end portions and a central portion located between the first and second end portions, wherein at least one of the first and second end portions has a larger width than the central portion.

According to an embodiment, each of the first and second end portions has a larger width than the central portion.

According to an embodiment, the elongate pattern has a vertical dimension that is greater than or equal to about 0.2 µm.

According to an embodiment, the elongate pattern has a vertical dimension in the range from about 0.2 µm to about 2 µm.

According to an embodiment, the elongate pattern has a length that is greater than or equal to about 20 µm.

According to an embodiment, the elongate pattern has a length in the range from about 20 µm to about 40 µm.

According to an embodiment, the central portion has a width in the range from about 3 µm to about 5 µm.

According to an embodiment, the elongate pattern is configured as a bar.

According to an embodiment, the elongate pattern is configured as a trench.

According to an embodiment, the elongate pattern has an "H" shape.

According to an embodiment, at least one sidewall of the elongate pattern has a concave shape.

According to an embodiment, at least one end face of the elongate pattern has a concave shape.

According to an embodiment, each end portion having a larger width than the central portion includes first and second lateral protrusions arranged mirror-symmetrically with respect to a central longitudinal axis of the elongate pattern.

Various embodiments provide an alignment mark, including: an elongate pattern having first and second end portions and a central portion located between the first and second end portions, wherein at least one of the first and second end portions has a shape that is configured to reduce a variation of difference between a thickness profile of a resist layer, which is to be deposited over the elongate pattern, at the central portion and a thickness profile of the resist layer, which is to be deposited over the elongate pattern, at the at least one of the first and second end portions.

Various embodiments provide a semiconductor workpiece, including: at least one alignment mark, including an elongate pattern having first and second end portions and a central portion located between the first and second end portions, wherein at least one of the first and second end portions has a larger width than the central portion.

According to an embodiment, each of the first and second end portions has a larger width than the central portion.

According to an embodiment, the elongate pattern is configured as a bar.

According to an embodiment, the elongate pattern is configured as a trench.

According to an embodiment, the elongate pattern has an "H" shape.

According to an embodiment, at least one sidewall of the elongate pattern has a concave shape.

According to an embodiment, at least one end face of the elongate pattern has a concave shape.

According to an embodiment, each end portion having a larger width than the central portion includes first and second lateral protrusions arranged mirror-symmetrically with respect to a central longitudinal axis of the elongate pattern.

According to an embodiment, the semiconductor workpiece is a wafer.

According to an embodiment, the wafer includes a kerf region; and the at least one alignment mark is disposed in the kerf region.

According to an embodiment, the at least one alignment mark is configured as a fine-alignment mark of the wafer.

According to an embodiment, the semiconductor workpiece includes a plurality of alignment marks, each alignment mark of the plurality of alignment marks including an elongate pattern having first and second end portions and a central portion located between the first and second end portions, wherein at least one of the first and second end portions has a larger width than the central portion.

While various aspects of this disclosure have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

The invention claimed is:

1. An alignment mark, comprising:
a plurality of elongate patterns, each pattern having first and second end portions and a central portion located between the first and second end portions, wherein at least one of the first and second end portions has a larger width than the central portion.

2. The alignment mark of claim 1,
wherein each of the first and second end portions has a larger width than the central portion.

3. The alignment mark of claim 1,
wherein the elongate pattern has a vertical dimension that is greater than or equal to about 0.2 µm.

4. The alignment mark of claim 1,
wherein the elongate pattern has a vertical dimension in the range from about 0.2 µm to about 2 µm.

5. The alignment mark of claim 1,
wherein the elongate pattern has a length that is greater than or equal to about 20 µm.

6. The alignment mark of claim 1,
wherein the elongate pattern has a length in the range from about 20 µm to about 40 µm.

7. The alignment mark of claim 1,
wherein the central portion has a width in the range from about 3 µm to about 5 µm.

8. The alignment mark of claim 1,
wherein the elongate pattern is configured as a bar.

9. The alignment mark of claim 1,
wherein the elongate pattern is configured as a trench.

10. The alignment mark of claim 1,
wherein the elongate pattern has an "H" shape.

11. The alignment mark of claim 1,
wherein at least one sidewall of the elongate pattern has a concave shape.

12. The alignment mark of claim 1,
wherein at least one end face of the elongate pattern has a concave shape.

13. The alignment mark of claim 1,
wherein each end portion having a larger width than the central portion comprises first and second lateral protrusions arranged mirror-symmetrically with respect to a central longitudinal axis of the elongate pattern.

14. An alignment mark, comprising:
an elongate pattern having first and second end portions and a central portion located between the first and second end portions,
wherein at least one of the first and second end portions has a shape that is configured to reduce a difference between a thickness profile of a resist layer, which is to be deposited over the elongate pattern, at the central portion and a thickness profile of the resist layer,
which is to be deposited over the elongate pattern, at the at least one of the first and second end portions.

15. A semiconductor workpiece, comprising:
at least one alignment mark, comprising an contiguous elongate pattern having first and second end portions and a central portion located between the first and second end portions,
wherein at least one of the first and second end portions has a larger width than the central portion.

16. The semiconductor workpiece of claim 15,
wherein each of the first and second end portions has a larger width than the central portion.

17. The semiconductor workpiece of claim 15,
wherein the elongate pattern is configured as a bar.

18. The semiconductor workpiece of claim 15,
wherein the elongate pattern is configured as a trench.

19. The semiconductor workpiece of claim 15,
wherein the elongate pattern has an "H" shape.

20. The semiconductor workpiece of claim 15,
wherein at least one sidewall of the elongate pattern has a concave shape.

21. The semiconductor workpiece of claim 15,
wherein at least one end face of the elongate pattern has a concave shape.

22. The semiconductor workpiece of claim 15,
wherein each end portion having a larger width than the central portion comprises first and second lateral protrusions arranged mirror-symmetrically with respect to a central longitudinal axis of the elongate pattern.

23. The semiconductor workpiece of claim 15,
wherein the semiconductor workpiece is a wafer.

24. The semiconductor workpiece of claim 23,
wherein the wafer comprises a kerf region; and
wherein the at least one alignment mark is disposed in the kerf region.

25. The semiconductor workpiece of claim 23,
wherein the at least one alignment mark is configured as a fine-alignment mark of the wafer.

26. The semiconductor workpiece of claim 15,
comprising a plurality of alignment marks, each alignment mark of the plurality of alignment marks comprising an elongate pattern having first and second end portions and a central portion located between the first and second end portions,
wherein at least one of the first and second end portions has a larger width than the central portion.

27. An alignment mark, comprising:
a contiguous elongate pattern having first and second end portions and a central portion located between the first and second end portions,
wherein at least one of the first and second end portions has a larger width than the central portion.

28. A semiconductor workpiece, comprising:
at least one alignment mark, comprising a plurality of elongate patterns, each elongate pattern having first and second end portions and a central portion located between the first and second end portions,
wherein at least one of the first and second end portions has a larger width than the central portion.

29. A semiconductor workpiece, comprising:
at least one alignment mark, comprising an elongate pattern having first and second end portions and a central portion located between the first and second end portions,
wherein at least one of the first and second end portions has a shape that is configured to reduce a difference between a thickness profile of a resist layer, which is to be deposited over the elongate pattern, at the central portion and a thickness profile of the resist layer,
which is to be deposited over the elongate pattern, at the at least one of the first and second end portions.

* * * * *

UNITED STATES PATENT AND TRADEMARK OFFICE
CERTIFICATE OF CORRECTION

| | | |
|---|---|---|
| PATENT NO. | : 8,674,524 B1 | Page 1 of 1 |
| APPLICATION NO. | : 13/650197 | |
| DATED | : March 18, 2014 | |
| INVENTOR(S) | : Andreas Woerz et al. | |

It is certified that error appears in the above-identified patent and that said Letters Patent is hereby corrected as shown below:

In the Claims

Column 10, line 62: "an contiguous" should read "a contiguous"

Signed and Sealed this
Seventeenth Day of March, 2015

Michelle K. Lee
*Director of the United States Patent and Trademark Office*